United States Patent
Matsushima et al.

(10) Patent No.: US 12,424,440 B2
(45) Date of Patent: Sep. 23, 2025

(54) RARE EARTH-CONTAINING SiC SUBSTRATE AND METHOD FOR PRODUCING SiC EPITAXIAL LAYER

(71) Applicant: NGK Insulators, Ltd., Nagoya (JP)

(72) Inventors: Kiyoshi Matsushima, Nagoya (JP); Morimichi Watanabe, Nagoya (JP); Jun Yoshikawa, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 356 days.

(21) Appl. No.: 17/805,234

(22) Filed: Jun. 3, 2022

(65) Prior Publication Data

US 2022/0328310 A1    Oct. 13, 2022

Related U.S. Application Data

(63) Continuation of application No. PCT/JP2020/002447, filed on Jan. 24, 2020.

(51) Int. Cl.
*H01L 21/02* (2006.01)

(52) U.S. Cl.
CPC .. *H01L 21/02378* (2013.01); *H01L 21/02433* (2013.01); *H01L 21/02529* (2013.01); *H01L 21/02581* (2013.01); *H01L 21/02609* (2013.01); *H01L 21/0262* (2013.01); *H01L 21/02667* (2013.01)

(58) Field of Classification Search
CPC ......... H01L 21/02378; H01L 21/02433; H01L 21/02529; H01L 21/02581; H01L 21/02609; H01L 21/0262; H01L 21/02667; H01L 21/02447
See application file for complete search history.

(56) References Cited

U.S. PATENT DOCUMENTS

| | | | |
|---|---|---|---|
| 2004/0037335 A1* | 2/2004 | Pekarik | H01L 33/0016 372/43.01 |
| 2009/0178610 A1 | 7/2009 | Sakamoto et al. | |
| 2016/0369424 A1 | 12/2016 | Seki et al. | |
| 2018/0274125 A1* | 9/2018 | Eto | H01B 1/04 |

(Continued)

FOREIGN PATENT DOCUMENTS

| | | |
|---|---|---|
| JP | H11-268995 A | 10/1999 |
| JP | 2007-277049 A | 10/2007 |

(Continued)

OTHER PUBLICATIONS

English translation of the International Preliminary Report on Patentability (Chapter I) dated Aug. 4, 2022 (Application No. PCT/JP2020/002447).

(Continued)

*Primary Examiner* — Jessica S Manno
*Assistant Examiner* — Andrew Chung
(74) *Attorney, Agent, or Firm* — BURR PATENT LAW, PLLC

(57) ABSTRACT

A rare earth-containing SiC substrate includes a rare earth element and Al. A concentration of the rare earth element is from $1\times10^{16}$ atoms/cm$^3$ to $1\times10^{19}$ atoms/cm$^3$ inclusive and a concentration of Al is from $1\times10^{16}$ atoms/cm$^3$ to $1\times10^{21}$ atoms/cm$^3$ inclusive.

8 Claims, 3 Drawing Sheets

(56) References Cited

U.S. PATENT DOCUMENTS

| | | |
|---|---|---|
| 2019/0333998 A1 | 10/2019 | Masumoto et al. |
| 2019/0376206 A1 | 12/2019 | Fukada et al. |
| 2021/0102311 A1 | 4/2021 | Tokuda et al. |

FOREIGN PATENT DOCUMENTS

| | | |
|---|---|---|
| JP | 2017-008369 A | 1/2017 |
| JP | 6122704 B2 | 4/2017 |
| JP | 2018-113303 A | 7/2018 |
| JP | 2019-218229 A | 12/2019 |
| RU | 1266253 A1 | 10/1996 |
| WO | 2014/189008 A1 | 11/2014 |

OTHER PUBLICATIONS

Chinese Office Action (with English translation) dated Jan. 10, 2024 (Application No. 202080089055.8).

International Search Report and Written Opinion (Application No. PCT/JP2020/002447) dated Apr. 21, 2020 (with English translation).

\* cited by examiner

RARE EARTH-CONTAINING SiC SUBSTRATE AND METHOD FOR PRODUCING SiC EPITAXIAL LAYER

BACKGROUND OF THE INVENTION

1. Field of the Invention

The present invention relates to a rare earth-containing SiC substrate and a method for producing a SiC epitaxial layer.

2. Description of the Related Art

SiC (silicon carbide) is receiving attention as a wide bandgap material that can control high voltage and high electric power with small loss. In particular, power semiconductor devices using SiC materials (SiC power devices) are recently expected to be used in various applications because the SiC power devices are more compact, consume less power, and have higher efficiency than devices using Si semiconductors. For example, the use of SiC power devices allows converters, inverters, vehicle-mounted chargers, etc. for electric vehicles (EVs) and plug-in hybrid electric vehicles (PHEVs) to be reduced in size to improve their efficiency.

To produce a SiC power device, it is necessary to grow a SiC epitaxial layer on a SiC single crystal substrate used as a base substrate. However, when basal plane dislocations (BPDs) present in the SiC single crystal substrate propagate into the SiC epitaxial layer, the defects may cause a fatal fault in the SiC device, which is not preferred. In the methods contemplated in PTL 1 and PTL 2, harmful BPDs are converted to harmless threading edge dislocations (TEDs) when SiC is epitaxially grown on a SiC single crystal substrate. PTL 3 discloses that, by adding a prescribed amount of Nb, Ta, Mo, W, or Ir to a SiC single crystal, thermal stress generated during the growth of the SiC single crystal is less likely to cause the occurrence of dislocations, so that dislocations are less likely to be generated when a SiC layer is formed on the SiC single crystal by epitaxial growth.

CITATION LIST

Patent Literature

PTL 1: Japanese Unexamined Patent Application Publication No. 2018-113303
PTL 2: Japanese Patent No. 6122704
PTL 3: Japanese Unexamined Patent Application Publication No. 2019-218229

SUMMARY OF THE INVENTION

However, in PTL 1 and PTL 2, the conversion rate from BPDs to TEDs is insufficient, and the quality of the SiC epitaxial layer is not high enough. The components such as Nb and Ta added to the SiC single crystal in PTL 3 may have an adverse effect on the properties of semiconductors. In this case, these components such as Nb and Ta cannot be added.

The present invention has been made to solve the foregoing problems, and it is a main object to provide a SiC substrate that allow a high-quality SiC epitaxial layer to grow.

The rare earth-containing SiC substrate of the invention contains a rare earth element, and a concentration of the rare earth element is from $1\times10^{16}$ atoms/cm$^3$ to $1\times10^{19}$ atoms/cm$^3$ inclusive.

In this rare earth-containing SiC substrate, the concentration of the rare earth element is set in the range of from $1\times10^{16}$ atoms/cm$^3$ to $1\times10^{19}$ atoms/cm$^3$ inclusive. Therefore, the density of BPDs in a SiC epitaxial growth layer grown on the rare earth-containing SiC substrate can be sufficiently lower than that in the rare earth-containing SiC substrate. The thus-obtained SiC epitaxial growth layer is suitable for producing a SiC device (such as a SiC-MOSFET or a SiC-SBD) by stacking a functional layer on the surface thereof. The rare earth-containing SiC substrate does not contain Nb, Ta, etc. and can therefore be used even under the conditions in which the components such as Nb and Ta have an influence on the properties of the semiconductor.

Preferably, the rare earth-containing SiC substrate of the invention contains Al. In this case, a concentration of Al is preferably from $1\times10^{16}$ atoms/cm$^3$ to $1\times10^{21}$ atoms/cm$^3$ inclusive. In this manner, the density of BPDs in the SiC epitaxial growth layer grown on the rare earth-containing SiC substrate can be further reduced. Preferably, (the concentration of Al)/(the concentration of the rare earth element) is from $1\times10^{-2}$ to $1\times10^5$ inclusive.

Preferably, the rare earth-containing SiC substrate of the invention contains N in addition to Al. In this case, a concentration of N is preferably from $1\times10^{17}$ atoms/cm$^3$ to $1\times10^{22}$ atoms/cm$^3$ inclusive. In this manner, the density of BPDs in the SiC epitaxial growth layer grown on the rare earth-containing SiC substrate can be further reduced. Preferably, (the concentration of N)/(the concentration of the rare earth element) is from $1\times10^{-2}$ to $1\times10^5$ inclusive.

Preferably, the rare earth element in the rare earth-containing SiC substrate of the invention is at least one selected from the group consisting of Y, Sm, Ho, Dy, and Yb.

Preferably, the rare earth-containing SiC substrate of the invention is oriented in both a c-axis direction and an a-axis direction.

Preferably, in the rare earth-containing SiC substrate of the invention, unevenness in the concentration of the rare earth element in a depth direction is 0.9 or more as expressed by the coefficient of variation. In this case, the density of BPDs in the SiC epitaxial growth layer grown on the rare earth-containing SIC substrate can be further reduced. A method for determining the coefficient of variation of the unevenness in the concentration of the rare earth element in the depth direction will be described later in Examples (Experimental Example 1).

The SiC epitaxial layer production method of the invention includes supplying a raw material gas for producing SiC to a surface of any of the above-described rare earth-containing SiC substrates to thereby form a SiC epitaxial layer on the surface of the rare earth-containing SiC substrate.

With this SiC epitaxial layer production method, the density of BPDs in the SiC epitaxial growth layer grown on the rare earth-containing SiC substrate can be sufficiently reduced.

DETAILED DESCRIPTION OF THE INVENTION

Figure 1:
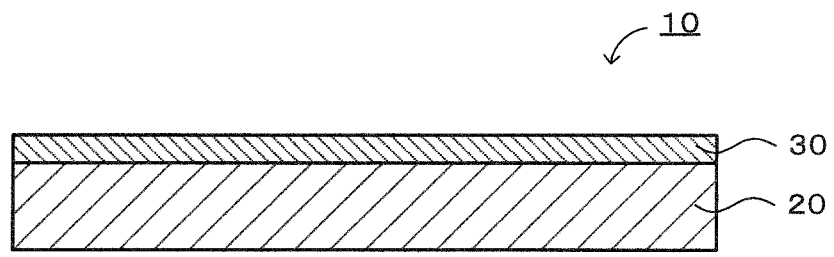
FIG. 1 is a vertical cross-sectional view of a SiC composite substrate 10.
Figure 2A:
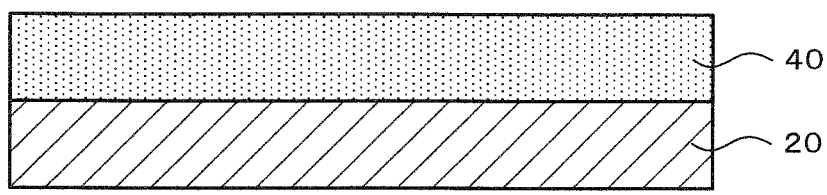
FIGS. 2A to 2C are production process charts of the SiC composite substrate 10.
Figure 2A:
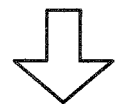
Figure 2B:
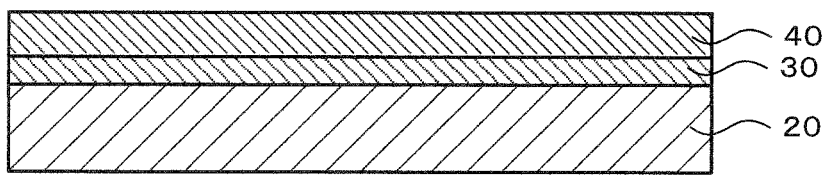
Figure 2B:
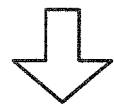
Figure 2C:
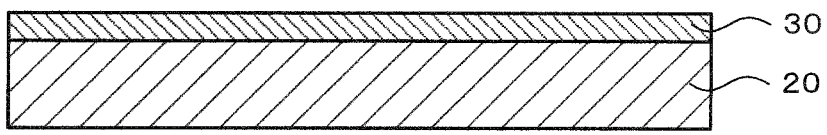

Preferred embodiments of the present invention will be described with reference to the drawings. FIG. 1 is a vertical cross-sectional view of a SiC composite substrate 10 (a cross-sectional view obtained by cutting the SiC composite substrate 10 along a plane including the center axis of the SiC composite substrate 10), and FIGS. 2A to 2C are production process charts of the SiC composite substrate 10.

The SiC composite substrate 10 in the present embodiment includes a SiC single crystal layer 20 and a rare earth-containing SiC layer 30 (corresponding to the rare earth-containing SiC substrate of the invention).

The SiC single crystal layer 20 is a layer formed of a SiC single crystal and has a crystal growth face. No particular limitation is imposed on the polytype, off-angle, and polarity of the SiC single crystal. The polytype is preferably 4H or 6H, and the off-angle is preferably 0.1 to 12° with respect to the [0001] axis of the single crystal SiC. The polarity is preferably the Si-face. More preferably, the polytype is 4H, and the off-angle is 1 to 5° with respect to the [0001] axis of the single crystal SiC. The polarity is more preferably the Si-face.

Preferably, the rare earth-containing SiC layer 30 is disposed on the crystal growth face of the SiC single crystal layer 20, and the SiC is oriented in both the c-axis direction and the a-axis direction. Specifically, the rare earth-containing SiC layer 30 is preferably a biaxially oriented SiC layer. The biaxially oriented SiC layer may be a SiC single crystal, a SiC polycrystal, or a mosaic crystal so long as the biaxially oriented SiC layer is oriented in the two directions, i.e., the c- and a-axis directions. The mosaic crystal is a crystal which does not have distinct grain boundaries but is a collection of crystals whose crystal orientations slightly deviate from one or both of the c- and a-axes. No particular limitation is imposed on the method for evaluating the orientations. For example, well-known analysis methods such as the EBSD (Electron Back Scatter Diffraction Patterns) method and the X-ray pole figure analysis can be used. When, for example, the EBSD method is used, an inverse pole figure map of a surface (plate surface) of the biaxially oriented SiC layer or its cross section perpendicular to the plate surface is determined. In the inverse pole figure map obtained, when the following four conditions are satisfied, the biaxially oriented SiC layer can be defined as being oriented in both a substantially normal direction and a substantially in-plane plate surface direction: (A) the crystals are oriented in a specific orientation (along a first axis) that extends in the substantially normal direction substantially normal to the plate surface; (B) the crystals are oriented in a specific orientation (along a second axis) that is orthogonal to the first axis and extends in the substantially in-plane plate surface direction; (C) the inclination angles of the crystals with respect to the first axis are distributed within ±10°; and (D) the inclination angles of the crystals with respect to the second axis are distributed within ±10°. In other words, when the above four conditions are satisfied, the biaxially oriented SiC layer is considered to be oriented along both the c- and a-axes. When, for example, the substantially normal direction substantially normal to the plate surface is aligned with the c-axis, it is only necessary that the substantially in-plane plate surface direction be aligned with a specific orientation (e.g., the a-axis) orthogonal to the c-axis. It is only necessary that the biaxially oriented SiC layer be oriented along the two axes, i.e., the substantially normal direction and the substantially in-plane plate surface direction, and it is preferable that the substantially normal direction is aligned with the c-axis. The narrower the distributions of the inclination angles with respect to the substantially normal direction and/or the substantially in-plane plate surface direction, the smaller the mosaicity of the biaxially oriented SiC layer. The closer the distributions of the inclination angles are to zero, the closer the biaxially oriented SiC layer is to a single crystal. Therefore, it is preferable from the viewpoint of the crystallinity of the biaxially oriented SiC layer that both the distributions of the inclination angles with respect to the substantially normal direction and the substantially in-plane plate surface direction are narrow. The distributions of the inclination directions are preferably, for example, within ±5° and more preferably within ±3°.

The SiC single crystal layer 20 contains BPDs. No particular limitation is imposed on the density of BPDs in the SiC single crystal layer 20. The density of BPDs is preferably $1 \times 10^5$/cm$^2$ or less and more preferably $1 \times 10^3$/cm$^2$ or less. The rare earth-containing SiC layer 30 contains a rare earth element, and the concentration of the rare earth element is in the range of from $1 \times 10^{16}$ atoms/cm$^3$ to $1 \times 10^{19}$ atoms/cm$^3$ inclusive. Since the concentration of the rare earth element is set in the above range, the density of BPDs in the SiC epitaxial layer grown on the rare earth-containing SiC layer 30 can be sufficiently lower than the density of BPDs in the rare earth-containing SiC layer 30. The rare earth-containing SiC layer 30 contains, as the rare earth element, at least one element selected from the group consisting of 17 elements including scandium, yttrium, lanthanum, cerium, praseodymium, neodymium, promethium, samarium, europium, gadolinium, terbium, dysprosium, holmium, erbium, thulium, ytterbium, and lutetium. The rare earth element is preferably at least one of Y and Yb. It is more preferable that the rare earth-containing SiC layer 30 further contains Al. In this case, the concentration of Al is preferably in the range of from $1 \times 10^{16}$ atoms/cm$^3$ to $1 \times 10^{21}$ atoms/cm$^3$ inclusive. In this manner, the density of BPDs in the SiC epitaxial layer grown on the rare earth-containing SiC layer 30 can be further reduced. Preferably, (the concentration of Al)/(the concentration of the rare earth element) is from $1 \times 10^{-2}$ to $1 \times 10^5$ inclusive. It is more preferable that the rare earth-containing SiC layer 30 contains N in addition to Al. In this case, the concentration of N is preferably from $1 \times 10^{17}$ atoms/cm$^3$ to $1 \times 10^{22}$ atoms/cm$^3$ inclusive. In this manner, the density of BPDs in the SiC epitaxial layer grown on the rare earth-containing SiC layer 30 can be further reduced. Preferably, (the concentration of N)/(the concentration of the rare earth element) is from $1 \times 10^{-2}$ to $1 \times 10^5$ inclusive.

Next, a method for producing the SiC composite substrate 10 will be described. In the following description, the rare earth-containing SiC layer 30 is produced on the SiC single crystal layer 20. Specifically, the method includes (a) the step of forming an unoriented precursor layer 40, (b) a heat treatment step, and (c) a grinding step. The unoriented precursor layer 40 later becomes the rare earth-containing SiC layer 30 through heat treatment described later. These steps will be described in order using FIGS. 2A to 2C. No limitation is imposed on the method for producing the SiC composite substrate 10, so long as a SiC layer 30 containing the rare earth element is obtained. For example, a gas phase method such as CVD or a sublimation method or a liquid phase method such as a solution method may be used.

(a) Step of forming unoriented precursor layer 40 (see FIG. 2A)

In the step of forming the unoriented precursor layer 40, the unoriented precursor layer 40 is formed on the crystal growth face of the SiC single crystal layer 20. The SiC single crystal layer 20 used is preferably the 4H or 6H polytype. The crystal growth face of the SiC single crystal layer 20 is preferably the Si-face with an off-angle of 0.1 to 12° with respect to the SiC [0001] axis. The off-angle is more preferably 1 to 5°.

To produce the unoriented precursor layer 40, any known method can be used. Examples of the method for forming the unoriented precursor layer 40 include: solid phase deposition methods such as an AD (aerosol deposition) method and an HPPD (hypersonic plasma particle deposition) method; vapor phase deposition methods such as a sputtering method, a vapor deposition method, a sublimation method, and various CVD (chemical vapor deposition) methods; and liquid phase deposition methods such as a solution growth method. Any method in which the unoriented precursor layer 40 is formed directly on the SiC single crystal layer 20 can be used. Examples of the CVD method that can be used include a thermal CVD method, a plasma CVD method, a mist CVD method, and a MO (metal organic) CVD method. In one method that can be used, a polycrystalline body produced in advance by, for example, any of a sublimation method, various CVD methods, and sintering is used as the unoriented precursor layer 40 and placed on the SiC single crystal layer 20. In another method that can be used, a shaped body for the unoriented precursor layer 40 is produced in advance and placed on the SiC single crystal layer 20. Such an unoriented precursor layer 40 may be a tape-cast body produced by tape casting or a compact formed by compression molding such as uniaxial pressing.

When the unoriented precursor layer 40 is formed, a raw material powder for the unoriented precursor layer 40 is prepared so as to contain a rare earth compound in an amount corresponding to the concentration of the rare earth element in the rare earth-containing SiC layer 30. No particular limitation is imposed on the rare earth compound, and examples of the rare earth compound include oxides, nitrides, carbides, fluorides, etc. of at least one of the 17 rare earth elements described above. When the rare earth-containing SiC layer 30 contains Al, an Al compound is added to the raw material powder of the unoriented precursor layer 40 according to the concentration of Al in the rare earth-containing SiC layer 30. No particular limitation is imposed on the Al compound, and examples of the Al compound include aluminum oxide, aluminum nitride, aluminum carbide, and aluminum fluoride. Moreover, when the rare earth-containing SiC layer 30 contains N, a nitrogen compound is added to the raw material powder of the unoriented precursor layer 40 according to the concentration of N in the rare earth-containing SiC layer 30. No particular limitation is imposed on the nitrogen compound, and examples thereof include aluminum nitride. When the rare earth-containing SiC layer 30 contains N, N may be added using any of the following methods. The raw material powder of the unoriented precursor layer 40 is used to synthesize the rare earth-containing SiC layer under a nitrogen atmosphere. Alternatively, a synthesized rare earth-containing SiC layer is annealed in a nitrogen atmosphere to introduce N.

When any of the various CVD methods, the sublimation method, and the solution growth method is used to form the unoriented precursor layer 40 directly on the SiC single crystal layer 20, epitaxial growth may occur on the SiC single crystal layer 20, so that the rare earth-containing SiC layer 30 may be deposited without the heat treatment step described later. However, it is preferable that the as-formed unoriented precursor layer 40 is not oriented, i.e., is an amorphous or unoriented polycrystal, and is oriented in the subsequent heat treatment step using the SiC single crystal as a seed. In this manner, the number of crystal defects reaching the surface of the rare earth-containing SiC layer 30 can be effectively reduced. Although the reason for this is unclear, it may be considered that the rearrangement of the crystal structure of the deposited unoriented solid precursor layer using the SiC single crystal as a seed is effective for annihilation of crystal defects. Therefore, when any of the various CVD methods, the sublimation method, the solution growth method, etc. is used, it is preferable to select conditions that do not cause epitaxial growth in the step of forming the unoriented precursor layer 40.

However, it is preferable to use the method in which the unoriented precursor layer 40 is formed directly on the SiC single crystal layer 20 using any of the AD method and the various CVD methods or the method in which the polycrystalline body produced separately using any of the sublimation method, the various CVD methods, and sintering is placed on the SiC single crystal layer 20. By using any of the above methods, the unoriented precursor layer 40 can be formed in a relatively short time. The AD method is particularly preferable because it does not need a high-vacuum process and its deposition rate is relatively high. In the method in which the polycrystalline body produced in advance is used as the unoriented precursor layer 40, some contrivance such as sufficient smoothening of the surface of the polycrystalline body is necessary in order to increase the adhesion between the polycrystalline body and the SiC single crystal layer 20. Therefore, it is preferable, from the viewpoint of cost, to use the method in which the unoriented precursor layer 40 is formed directly. The method in which the shaped body produced in advance is placed on the SiC single crystal layer 20 is also preferable because it is a simple method. However, since the unoriented precursor layer 40 is formed from a powder, a process for sintering the power is required in the heat treatment step described later. In any of the above methods, well-known conditions can be used. Next, the method in which the unoriented precursor layer 40 is formed directly on the SiC single crystal layer 20 using the AD method or the thermal CVD method and the method in which the shaped body produced in advance is placed on the SiC single crystal layer 20 will be described.

Figure 3:
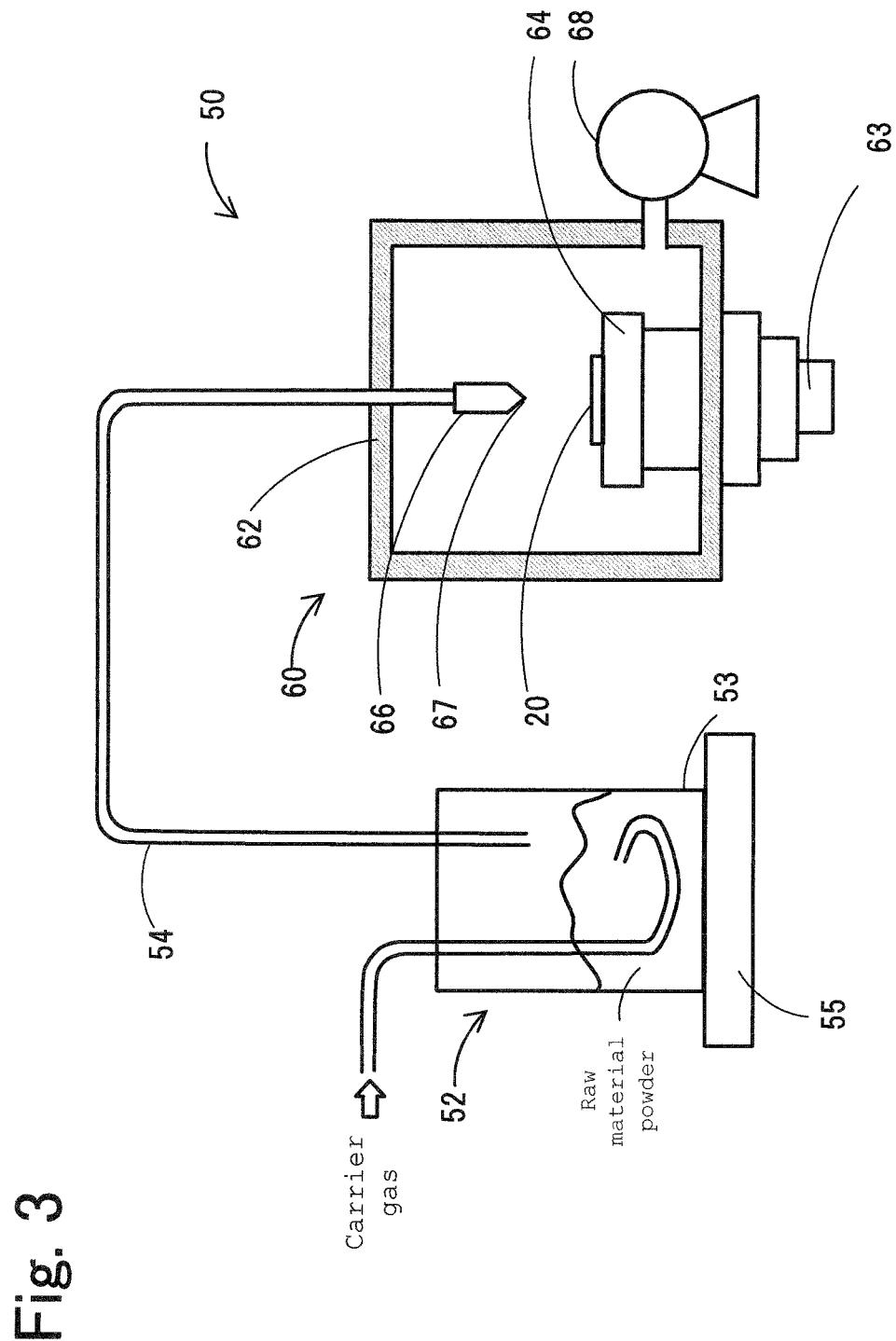
FIG. 3 is a conceptual diagram of an AD device 50.

The AD method is a technique for forming a coating by mixing fine particles or a raw material of the fine particles with a gas to form an aerosol and ejecting the aerosol at high speed from a nozzle onto a substrate to cause the aerosol to collide with the substrate, and one feature of the AD method is that the coating can be formed at room temperature. FIG. 3 shows an example of a deposition device (AD device) used for the AD method. The AD device 50 shown in FIG. 3 is configured as a device used for the AD method in which a raw material powder is ejected onto a substrate in a low-pressure atmosphere having a pressure lower than the atmospheric pressure. The AD device 50 includes: an aerosol generation unit 52 that generates an aerosol of the raw material powder containing the raw material component; and a deposition unit 60 configured to eject the raw material powder onto the SiC single crystal layer 20 to form a film containing the raw material component. The aerosol generation unit 52 includes: an aerosol generation chamber 53 that houses the raw material powder and is configured to generate the aerosol using a carrier gas supplied from an unillustrated gas cylinder; a raw material supply pipe 54 configured to supply the generated aerosol to the deposition unit 60; and a vibrator 55 that vibrates the aerosol generation chamber 53 and the aerosol therein at a frequency of 10 to 100 Hz. The deposition unit 60 includes: a deposition chamber 62 in which the aerosol is ejected onto the SiC single crystal layer 20; a substrate holder 64 that is disposed inside the deposition chamber 62 and fixes the SiC single crystal layer 20; and an X-Y stage 63 that moves the substrate holder 64 in the X axis and Y axis directions. The deposition unit 60 further includes: an ejection nozzle 66 that has a slit 67 at its forward end and ejects the aerosol onto the SiC single crystal layer 20; and a vacuum pump 68 that evacuates the deposition chamber 62. The ejection nozzle 66 is attached to the forward end of the raw material supply pipe 54.

It is known that, with the AD method, pores are formed in the film or the film is in the form of a compact, but this depends on the deposition conditions. For example, the AD method is easily affected by the collision speed of the raw material powder with the substrate, the particle diameter of the raw material powder, the aggregation state of the raw material powder in the aerosol, the ejection amount per unit time, etc. The collision speed of the raw material powder with the substrate is influenced by the difference in internal pressure between the deposition chamber 62 and the ejection nozzle 66, the opening area of the ejection nozzle, etc. Therefore, to obtain a dense unoriented precursor layer, it is necessary to control these factors appropriately.

In the thermal CVD method, a well-known deposition device such as a commercial deposition device can be used. No particular limitation is imposed on the raw material gases. Silicon tetrachloride ($SiCl_4$) gas or silane ($SiH_4$) gas can be used as the supply source of Si, and methane ($CH_4$) gas, propane ($C_3H_8$) gas, etc. can be used as the supply source of C. The deposition temperature is preferably 1000 to 2200° C., more preferably 1100 to 2000° C., and still more preferably 1200 to 1900° C.

It is known that, when the thermal CVD method is used for deposition on the SiC single crystal layer 20, epitaxial growth occurs on the SiC single crystal layer 20, so that the rare earth-containing SiC layer 30 may be formed. However, it is preferable that the as-produced unoriented precursor layer 40 is not oriented, i.e., is an amorphous or unoriented polycrystal, and subjected to the heat treatment step to cause rearrangement of the crystals using the SiC single crystal as a seed crystal. It is known that, when the thermal CVD method is used to form the amorphous or polycrystalline layer on the SiC single crystal, the formation is influenced by the deposition temperature, the flow rates of Si and C source gases, their ratio, the deposition pressure, etc. The influence of the deposition temperature is large. It is preferable that the deposition temperature is lower from the viewpoint of forming the amorphous or polycrystalline layer. The deposition temperature is preferably lower than 1700° C., more preferably 1500° C. or lower, and particularly preferably 1400° C. or lower. However, if the deposition temperature is excessively low, the deposition rate itself is reduced. Therefore, it is preferable that the deposition temperature is higher from the viewpoint of the deposition rate.

When the shaped body as the unoriented precursor layer 40 produced in advance is used, the shaped body can be formed by shaping the raw material powder of the unoriented precursor. For example, when press forming is used, the unoriented precursor layer 40 is a press-formed body. The press-formed body can be produced by subjecting the raw material powder of the unoriented precursor to press forming using a well-known method. For example, the press-formed body may be produced by placing the raw material powder in a mold and pressing the raw material powder at a pressure of preferably 100 to 400 $kgf/cm^2$ and more preferably 150 to 300 $kgf/cm^2$. No particular limitation is imposed on the molding method. In addition to the press forming, tape casting, extrusion molding, pouring, a doctor blade method, or any combination thereof can be used. When, for example, tape casting is used, it is preferable to use the following procedure. Additives such as a binder, a plasticizer, a dispersant, and a dispersion medium are appropriately added to the raw material powder to prepare a slurry. Then the slurry is caused to pass through a narrow slit-shaped ejection hole, and the ejected slurry is thereby formed into a sheet shape. No particular limitation is imposed on the thickness of the sheet-shaped cast body. From the viewpoint of handleability, the thickness is preferably 5 to 500 μm. When a thick unoriented precursor layer is necessary, a plurality of sheet-shaped cast bodies are stacked to obtain the desired thickness. When any of the above shaped bodies is used, the shaped body is later subjected to heat treatment on the SiC single crystal layer 20, and a portion near the SiC single crystal layer 20 is transformed to the rare earth-containing SiC layer 30. In this method, it is necessary to sinter the shaped body in the heat treatment step described later. It is preferable that the rare earth-containing SiC layer 30 is formed after the step of sintering the shaped body to integrate the polycrystalline body and the SiC single crystal layer 20 together. If the shaped body does not experience the sintered state, epitaxial growth using the SiC single crystal as a seed may be insufficient. Therefore, the shaped body may contain additives such as a sintering aid in addition to the SiC raw materials.

(b) Heat Treatment Step (see FIG. 2B)

In the heat treatment step, a stacked body including the unoriented precursor layer 40 stacked or placed on the SiC single crystal layer 20 is subjected to heat treatment to form the rare earth-containing SiC layer 30. No particular limitation is imposed on the heat treatment method so long as epitaxial growth using the SiC single crystal layer 20 as a seed occurs. The heat treatment method can be performed in a well-known heat treatment furnace such as a tubular furnace or a hot plate. In addition to the heat treatment at normal pressure (treatment without pressing), heat treatment under pressure such as hot pressing or HIP or a combination of the heat treatment at normal pressure and the heat treatment under pressure may be used. The atmosphere during the heat treatment can be selected from a vacuum atmosphere, a nitrogen atmosphere, and an inert gas atmosphere. The heat treatment temperature is preferably 1700 to 2700° C. When the temperature is high, the unoriented precursor layer 40 can easily grow while oriented along the c-axis and a-axis with the SiC single crystal layer 20 serving as a seed crystal. Therefore, the temperature is preferably 1700° C. or higher, more preferably 1850° C. or higher, still more preferably 2000° C. or higher, and particularly preferably 2200° C. or higher. If the temperature is excessively high, part of SiC may be lost by sublimation, or SiC may plastically deform, so that problems such as warpage may occur. Therefore, the temperature is preferably 2700° C. or lower and more preferably 2500° C. or lower. The heat treatment temperature and the holding time are related to the thickness of the rare earth-containing SiC layer 30 formed by the epitaxial growth and can be controlled appropriately.

When the shaped body produced in advance is used as the unoriented precursor layer 40, the shaped body must be sintered during the heat treatment. Therefore, normal pressure sintering at high temperature, hot pressing, HIP, or a combination thereof is preferred. When, for example, hot pressing is used, the contact pressure is preferably 50 kgf/cm² or more, more preferably 100 kgf/cm² or more, and particularly preferably 200 kgf/cm² or more, and the upper limit of the contact pressure is not particularly specified. No particular limitation is imposed on the firing temperature, so long as sintering and epitaxial growth occur. The firing temperature is preferably 1700° C. or higher, more preferably 1800° C. or higher, still more preferably 2000° C. or higher, and particularly preferably 2200° C. or higher. The atmosphere during firing can be selected from a vacuum atmosphere, a nitrogen atmosphere, an inert atmosphere, and a mixture of nitrogen and an inert gas. The SiC powder used as a raw material may be α-SiC or β-SiC. Preferably, the SiC powder is formed from SiC particles having an average particle diameter of 0.01 to 5 µm. The average particle diameter means the average value of the maximum unidirectional particle diameters of 100 primary particles obtained when the powder is observed under a scanning electron microscope.

In the heat treatment step, crystals in the unoriented precursor layer 40 grow from the crystal growth face of the SIC single crystal layer 20 while oriented along the c-axis and a-axis. Therefore, the unoriented precursor layer 40 is gradually transformed into the rare earth-containing SiC layer 30 on the crystal growth face. In the rare earth-containing SiC layer 30 formed, the density of BPDs is low (for example, $1\times10^2/cm^2$ or lower). The reason that the density of BPDs is low as described above is unknown. However, this may be related to bending of dislocations during the crystal growth, conversion to stacking faults extending in a direction orthogonal to the c-axis, pair annihilation of defects, etc. The density of BPDs is measured by well-known etch pit evaluation using KOH melt etching.

(C) Grinding Step (see FIG. 2C)

In the grinding step, the unoriented precursor layer 40 remaining on the rare earth-containing SiC layer 30 after the annealing step is ground and removed to expose the surface of the rare earth-containing SiC layer 30, and the exposed surface is polished using diamond abrasive grains and subjected to CMP (chemical-mechanical polishing) treatment. The SiC composite substrate 10 is obtained in the manner described above.

Next, a description will be given of a method for growing the SiC epitaxial layer on the surface of the rare earth-containing SiC layer 30 in the SiC composite substrate 10. No particular limitation is imposed on the method for growing the SiC epitaxial layer, and any known method can be used. For example, the SiC composite substrate 10 may be placed on a susceptor in a CVD apparatus such that the surface of the rare earth-containing SiC layer 30 faces upward, and then epitaxial growth may be performed using silane and propane as raw material gases and hydrogen supplied as a carrier gas. In this case, the growth temperature is set within the range of preferably from 1570° C. to 1610° C. inclusive. The concentration ratio C/Si is set within the range of preferably from 0.7 to 1.2 inclusive.

In the above-described rare earth-containing SiC layer 30 of the SiC composite substrate 10 in the present embodiment, the concentration of the rare earth element is set within the range of from $1\times10^{16}$ atoms/cm³ to $1\times10^{19}$ atoms/cm³ inclusive. Therefore, the density of BPDs in the SiC epitaxial growth layer grown on this rare earth-containing SiC layer 30 can be sufficiently lower than the density of BPDs in the rare earth-containing SiC layer 30. The thus-obtained SiC epitaxial growth layer is suitable for producing a SiC device (such as a SiC-MOSFET or a SiC-SBD) by stacking a functional layer on the surface thereof. Moreover, since the rare earth-containing SiC layer 30 does not contain Nb, Ta, etc., it can be used under the conditions in which the components such as Nb and Ta have an influence on the properties of the semiconductor.

Preferably, the rare earth-containing SiC layer 30 further contains Al. In this case, the concentration of Al is preferably from $1\times10^{16}$ atoms/cm³ to $1\times10^{21}$ atoms/cm³ inclusive. In this manner, the density of BPDs in the SiC epitaxial growth layer grown on the rare earth-containing SiC layer 30 can be further reduced.

Preferably, the rare earth-containing SiC layer 30 contains N in addition to Al. In this case, the concentration of N is preferably from $1\times10^{27}$ atoms/cm³ to $1\times10^{22}$ atoms/cm³ inclusive. In this manner, the density of BPDs in the SIC epitaxial growth layer grown on the rare earth-containing SiC layer 30 can be further reduced.

The SiC epitaxial layer is formed on the surface of the rare earth-containing SiC layer 30 by supplying a raw material gas for producing SiC to the surface. With this production method, the density of BPDs in the SiC epitaxial growth layer grown on the rare earth-containing SiC layer 30 can be sufficiently lower than the density of BPDs in the rare earth-containing SIC layer 30.

Moreover, it is preferable from the viewpoint of reducing the density of BPDs in the SiC epitaxial growth layer that argon is contained in the vicinity of the interface between the SiC single crystal layer 20 and the rare earth-containing SiC layer 30.

The present invention is not at all limited to the embodiments described above, and it will be appreciated that the present invention can be implemented in various forms so long as they fall within the technical scope of the invention.

For example, in the embodiments described above, only one rare earth-containing SiC layer 30 is disposed on the SIC single crystal layer 20. However, two or more rare earth-containing SiC layers 30 may be disposed.

Specifically, an unoriented precursor layer 40 may be stacked on the rare earth-containing SiC layer 30 of the SiC composite substrate 10 and subjected to heat treatment, annealing, and grinding in this order to thereby form a second rare earth-containing SiC layer 30 on the rare earth-containing SiC layer 30.

EXAMPLES

Examples of the present invention will next be described. Experimental Examples 1 to 12 below correspond to Examples of the present invention, and Experimental Examples 13 to 18 correspond to Comparative Examples. The following Examples do not limit the invention in any manner.

Experimental Example 1

1. Production of SiC Composite Substrate
(1) Production of Unoriented Precursor Layer A raw material powder containing 91.6% by weight of a commercial fine β-SiC powder (volume-based D50: 0.7 µm), 7.1% by weight of an yttrium oxide powder (volume-based D50: 0.1 µm), and 1.3% by weight of an aluminum nitride powder (volume-based D50: 0.5 µm) was mixed in ethanol in a ball mill using SiC balls for 24 hours and then dried to obtain a powder mixture. A commercial SiC single crystal substrate (n-type 4H-SiC, diameter: 50.8 mm (2 inches), Si-face, (0001) plane, off-angle: 4°, thickness: 0.35 mm, no orientation flat, BPD density: $1.0 \times 10^5/cm^2$) was prepared as a SiC single crystal layer, and the powder mixture was injected onto the SiC single crystal substrate using the AD device 50 shown in FIG. 3 to thereby form an AD film (unoriented precursor layer).

The AD deposition conditions are as follows. The carrier gas was $N_2$, and the film was formed using a ceramic-made nozzle having a slit with a long side length of 5 mm×a short side length of 0.4 mm. The scanning conditions of the nozzle are as follows. The speed of scanning was 0.5 mm/s. The scanning was repeated such that the nozzle was moved 55 mm in a forward direction perpendicular to the long sides of the slit, moved 5 mm in the long side direction of the slit, moved 55 mm in a backward direction perpendicular to the long sides of the slit, and moved 5 mm in the long side direction of the slit toward the side opposite to the initial position. After the nozzle had been moved 55 mm from the initial position in the long side direction of the slit, the scanning direction was reversed, and the nozzle was returned to the initial position. The above cyclic operation was defined as one cycle and repeated 1200 times. The thickness of the thus-formed AD film was about 120 µm.

(2) Heat Treatment of Unoriented Precursor Layer

The SiC single crystal substrate on which the AD film serving as the unoriented precursor layer had been formed was removed from the AD device, annealed in a $N_2$ atmosphere at 1950° C. for 6 hours, and then annealed in an argon atmosphere at 2450° C. for 5 hours. Specifically, the unoriented precursor layer was heat-treated to form a heat-treated layer.

(3) Grinding and Polishing
(3-1) Polishing 1

The SiC single crystal substrate was polished using diamond abrasive grains such that the entire front surface of the obtained heat-treated layer was parallel to the back surface (the bottom surface of the SiC single crystal substrate) and then subjected to chemical-mechanical polishing (CMP) to thereby obtain a composite substrate.

(3-2) Polishing 2

A sample produced separately by the same methods as in (1) and (2) was prepared and cut in a direction orthogonal to the plate surface along a line passing through a central portion of the substrate. The cut sample was subjected to lapping using diamond abrasive grains to smoothen its cross section and then subjected to chemical-mechanical polishing (CMP) to a mirror finish.

2. Evaluation of Heat-Treated Layer
(1) Biaxial Orientation

The EBSD (Electron Back Scatter Diffraction Patterns) method was used to measure the inverse pole figure map of the surface (plate surface) of the heat-treated layer produced in (3-1) and the inverse pole figure map of the cross section orthogonal to the plate surface of the heat-treated layer produced in (3-2). The distributions of inclination angles with respect to the substantially normal direction and the substantially in-plane plate surface direction were within 0.01°, and the heat-treated layer was judged to be a biaxially oriented SiC layer oriented along the c-axis and the a-axis.

[EBSD Measurement Conditions]
Acceleration voltage: 15 kV
Spot intensity: 70
Working distance: 22.5 mm
Step size: 0.5 µm
Specimen inclination angle: 70°
Measurement program: Aztec (version 3.3)

(2) Contents of Y, Al, and N in Biaxially Oriented SiC Layer

1. Dynamic secondary ion mass spectrometry (D-SIMS) was performed on the polished surface of a composite substrate produced using the same methods as in (1) to (3) (3-1). An analyze IMF-6f manufactured by CAMECA was used for Y and Al. In this measurement, the primary ion species was $O_2+$, and the acceleration voltage was 8 kV. An analyzer IMF-7f manufactured by CAMECA was used for N. In this measurement, the primary ion species was $C_s+$, and the acceleration voltage was 14.5 kV. In this manner, the contents of Y, Al, and N (average values of 224 data points in a region within 10 µm in the depth direction) were determined. Moreover, the concentration ratio Y/Al and the concentration ratio N/Y were determined. To represent unevenness in the concentration of Y in the region within 10 µm in the depth direction, the coefficient of variation was computed. Specifically, the standard deviation and the average value of the 224 data points in the region within 10 µm in the depth direction were computed, and the standard deviation was divided by the average value to determine the coefficient of variation. The results obtained are shown in Table 1.

3. CVD of SiC Epitaxial Layer

1. A composite substrate produced using the same methods as in (1) to (3) (3-1) was placed in a CVD device. Silane and propane were used as raw material gases, and hydrogen was supplied as a carrier gas to epitaxially grow a layer on the biaxially oriented SiC layer of the composite substrate. In this case, the growth temperature was set to 1600° C., and the concentration ratio C/Si was set to 1.2. The SiC epitaxial layer (single crystal layer) was formed on the biaxially oriented SiC layer until the film thickness reached 10 µm to thereby obtain a SiC epitaxial substrate.

4. Evaluation of SiC Epitaxial Layer

The density of BPDs on the surface of the SiC epitaxial substrate obtained in 3 was evaluated by the following method. The composite substrate, together with KOH crystals, was placed in a nickel-made crucible and subjected to etching treatment in an electric furnace at 500° C. for 10 minutes. The evaluation sample subjected to the etching treatment was washed and observed under an optical microscope, and the number of pits indicating BPDs was counted using a well-known method. Specifically, images of 100 viewing areas having a length of 2.3 mm×a width of 3.6 mm in arbitrary regions of the surface of the evaluation sample were taken at a magnification of 50×, and the total number of pits was counted. The total number of pits counted was divided by a total area of 8.05 cm² to compute the density of BPDs. The results are as shown in Table 1.

the unevenness in Y in the thickness direction, the concentration ratio Al/Y, the concentration ratio N/Y, and the density of BPDs on the surface of the SiC epitaxial layer are as shown in Table 1.

TABLE 1

| Experimental Example | Concentrations in the biaxially oriented SiC layer (atoms/cm³) | | | | Coefficient of variation ※2 | Rare earth element and concentration ratio of Al and Y Al/Y |
|---|---|---|---|---|---|---|
| | Y | Sm | Al | N | | |
| 1 | $3.0 \times 10^{18}$ | ND | $4.5 \times 10^{20}$ | $1.5 \times 10^{21}$ | 0.7 | $1.5 \times 10^{2}$ |
| 2 | $1.5 \times 10^{18}$ | ND | $4.4 \times 10^{20}$ | $1.5 \times 10^{21}$ | 0.9 | $2.9 \times 10^{2}$ |
| 3 | $2.1 \times 10^{16}$ | ND | $6.6 \times 10^{16}$ | $2.3 \times 10^{17}$ | 0.6 | $3.1 \times 10^{0}$ |
| 4 | $2.0 \times 10^{16}$ | ND | $4.6 \times 10^{20}$ | $1.6 \times 10^{21}$ | 0.6 | $2.3 \times 10^{4}$ |
| 5 | $3.1 \times 10^{18}$ | ND | $6.5 \times 10^{16}$ | $2.2 \times 10^{17}$ | 0.7 | $2.1 \times 10^{-2}$ |
| 6 | $2.8 \times 10^{18}$ | ND | $3.9 \times 10^{20}$ | ND※1 | 0.7 | $1.4 \times 10^{2}$ |
| 7 | $2.3 \times 10^{16}$ | ND | $3.3 \times 10^{16}$ | ND | 0.6 | $1.4 \times 10^{0}$ |
| 8 | $3.2 \times 10^{16}$ | ND | ND | $1.4 \times 10^{20}$ | 0.6 | — |
| 9 | $3.2 \times 10^{18}$ | ND | ND | ND | 0.7 | — |
| 10 | $2.0 \times 10^{16}$ | ND | ND | ND | 0.6 | — |
| 11 | $2.9 \times 10^{18}$ | ND | $4.4 \times 10^{20}$ | $1.5 \times 10^{21}$ | 2.0 | $1.5 \times 10^{2}$ |
| 12 | ND | $2.2 \times 10^{16}$ | $6.5 \times 10^{16}$ | $2.2 \times 10^{17}$ | 0.6 | — |
| 13 | $2.4 \times 10^{15}$ | ND | ND | ND | 0.5 | — |
| 14 | $1.2 \times 10^{19}$ | ND | ND | ND | 0.6 | — |
| 15 | $2.1 \times 10^{15}$ | ND | $9.2 \times 10^{15}$ | ND | 0.5 | $4.4 \times 10^{0}$ |
| 16 | $1.4 \times 10^{19}$ | ND | $2.6 \times 10^{21}$ | ND | 0.6 | $1.9 \times 10^{2}$ |
| 17 | $1.9 \times 10^{15}$ | ND | $9.7 \times 10^{15}$ | $4.4 \times 10^{16}$ | 0.5 | $5.1 \times 10^{0}$ |
| 18 | $1.3 \times 10^{19}$ | ND | $7.3 \times 10^{21}$ | $2.6 \times 10^{22}$ | 0.6 | $5.6 \times 10^{2}$ |

| Experimental Example | Rare earth element and concentration ratio of Al and Y | | | Density of BPDs (/cm²) | |
|---|---|---|---|---|---|
| | N/Y | Al/Sm | N/Sm | Surface of SiC single crystal layer | Surface of SiC epitaxial layer |
| 1 | $5.0 \times 10^{2}$ | — | — | $1.0 \times 10^{5}$ | $1.7 \times 10^{-2}$ |
| 2 | $5.0 \times 10^{2}$ | — | — | | $5.3 \times 10^{-3}$ |
| 3 | $1.1 \times 10^{1}$ | — | — | | $4.1 \times 10^{-2}$ |
| 4 | $8.0 \times 10^{4}$ | — | — | | $4.0 \times 10^{-1}$ |
| 5 | $7.1 \times 10^{-2}$ | — | — | | $3.8 \times 10^{-1}$ |
| 6 | — | — | — | | $4.1 \times 10^{-1}$ |
| 7 | — | — | — | | $3.5 \times 10^{-1}$ |
| 8 | $4.4 \times 10^{1}$ | — | — | | $4.7 \times 10^{-1}$ |
| 9 | — | — | — | | $8.9 \times 10^{-1}$ |
| 10 | — | — | — | | $9.1 \times 10^{-1}$ |
| 11 | $5.0 \times 10^{2}$ | — | — | | $3.1 \times 10^{-3}$ |
| 12 | — | $3.0 \times 10^{0}$ | $1.0 \times 10^{1}$ | | $4.9 \times 10^{-2}$ |
| 13 | — | — | — | | $2.0 \times 10^{1}$ |
| 14 | — | — | — | | $1.3 \times 10^{1}$ |
| 15 | — | — | — | | $1.3 \times 10^{1}$ |
| 16 | — | — | — | | $1.1 \times 10^{1}$ |
| 17 | $2.3 \times 10^{1}$ | — | — | | $9.9 \times 10^{0}$ |
| 18 | $2.0 \times 10^{3}$ | — | — | | $1.3 \times 10^{1}$ |

※1 ND stands for below the limit of detection.
※2 The coefficient of variation of the concentration of the rare earth element in the depth direction.

Experimental Example 2

An experiment was performed in the same manner as in Experimental Example 1 except that (A) a raw material powder containing 91.6% by weight of the β-SiC powder, 7.1% by weight of the yttrium oxide powder, and 1.3% by weight of the aluminum nitride powder and (B) a raw material powder containing 98.5% by weight of the β-SiC powder, 0.05% by weight of the yttrium oxide powder, and 1.4% by weight of the aluminum nitride powder were deposited alternately to a thickness of 2 μm until a total thickness of 120 μm by the AD method such that a composition (A) layer→a composition (B) layer→a composition (A) layer, . . . were formed. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

Experimental Example 3

An experiment was performed in the same manner as in Experimental Example 1 except that a raw material powder containing 99.95% by weight of the 3-SiC powder, 0.05% by weight of the yttrium oxide powder, and 0.0002% by weight of the aluminum nitride powder was used and that the annealing in a N₂ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

Experimental Example 4

An experiment was performed in the same manner as in Experimental Example 1 except that a raw material powder containing 98.65% by weight of the β-SiC powder, 0.05% by weight of the yttrium oxide powder, and 1.3% by weight of the aluminum nitride powder was used. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

Experimental Example 5

An experiment was performed in the same manner as in Experimental Example 1 except that a raw material powder containing 92.90% by weight of the β-SiC powder, 7.1% by weight of the yttrium oxide powder, and 0.0002% by weight of the aluminum nitride powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

Experimental Example 6

An experiment was performed in the same manner as in Experimental Example 1 except that a raw material powder containing 89.1% by weight of the β-SiC powder, 7.1% by weight of the yttrium oxide powder, and 3.8% by weight of an aluminum oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, and the density of BPDs on the surface of the SiC epitaxial layer are as shown in Table 1.

Experimental Example 7

An experiment was performed in the same manner as in Experimental Example 1 except that a raw material powder containing 99.95% by weight of the β-SiC powder, 0.05% by weight of the yttrium oxide powder, and 0.0003% by weight of an aluminum oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, and the density of BPDs on the surface of the SiC epitaxial layer are as shown in Table 1.

Experimental Example 8

An experiment was performed in the same manner as in Experimental Example 1 except that a raw material powder containing 92.9% by weight of the β-SiC powder and 7.1% by weight of the yttrium oxide powder was used. The heat-treated layer obtained was found to be a biaxially oriented SiC layer. The concentrations of Y, Al, and N in the biaxially oriented SiC layer, the unevenness in Y in the thickness direction, the concentration ratio N/Y, and the density of BPDs on the surface of the SiC epitaxial layer are as shown in Table 1.

Experimental Example 9

An experiment was performed in the same manner as in Experimental Example 1 except that a raw material powder containing 92.9% by weight of the β-SiC powder and 7.1% by weight of the yttrium oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, and the density of BPDs on the surface of the SiC epitaxial layer are as shown in Table 1.

Experimental Example 10

An experiment was performed in the same manner as in Experimental Example 1 except that a raw material powder containing 99.95% by weight of the β-SiC powder and 0.05% by weight of the yttrium oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, and the density of BPDs on the surface of the SiC epitaxial layer are as shown in Table 1.

Experimental Example 11

An experiment was performed in the same manner as in Experimental Example 2 except that (A) a raw material powder containing 91.6% by weight of the β-SiC powder, 7.1% by weight of the yttrium oxide powder, and 1.3% by weight of the aluminum nitride powder and (B) a raw material powder containing 98.6% by weight of the β-SiC powder, 0.005% by weight of the yttrium oxide powder, and 1.4% by weight of the aluminum nitride powder were used. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

Experimental Example 12

An experiment was performed in the same manner as in Experimental Example 1 except that a raw material powder containing 99.92% by weight of the 3-SiC powder, 0.08% by weight of a samarium oxide powder, and 0.0002% by weight of the aluminum nitride powder was used and that the annealing in a $N_2$ atmosphere at 1950° C. was not performed. The heat-treated layer obtained was found to be a biaxially oriented SiC layer. The concentrations of Sm, Al, and N in the biaxially oriented SiC layer, the unevenness in Y in the thickness direction, the concentration ratio Al/Sm, the concentration ratio N/Sm, and the density of BPDs on the surface of the SiC epitaxial layer are as shown in Table 1.

Experimental Example 13

An experiment was performed in the same manner as in Experimental Example 1 except that a raw material powder containing 99.995% by weight of the β-SiC powder and 0.005% by weight of the yttrium oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, and the density of BPDs on the surface of the SiC epitaxial layer are as shown in Table 1.

Experimental Example 14

An experiment was performed in the same manner as in Experimental Example 1 except that a raw material powder containing 80.0% by weight of the β-SiC powder and 20.0% by weight of the yttrium oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, and the density of BPDs on the surface of the SiC epitaxial layer are as shown in Table 1.

Experimental Example 15

An experiment was performed in the same manner as in Experimental Example 1 except that a raw material powder containing 99.995% by weight of the β-SiC powder, 0.005% by weight of the yttrium oxide powder, and 0.0001% by weight of an aluminum oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, and the density of BPDs on the surface of the SiC epitaxial layer are as shown in Table 1.

Experimental Example 16

An experiment was performed in the same manner as in Experimental Example 1 except that a raw material powder containing 60.0% by weight of the β-SiC powder, 20.0% by weight of the yttrium oxide powder, and 20.0% by weight of an aluminum oxide powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, and the density of BPDs on the surface of the SiC epitaxial layer are as shown in Table 1.

Experimental Example 17

An experiment was performed in the same manner as in Experimental Example 1 except that a raw material powder containing 99.995% by weight of the β-SiC powder, 0.005% by weight of the yttrium oxide powder, and 0.0001% by weight of the aluminum nitride powder was used and that the annealing in a $N_2$ atmosphere at 1950° C. was not performed. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

Experimental Example 18

An experiment was performed in the same manner as in Experimental Example 1 except that a raw material powder containing 60.0% by weight of the β-SiC powder, 20.0% by weight of the yttrium oxide powder, and 20.0% by weight of the aluminum nitride powder was used. The heat-treated layer obtained was found to be a biaxially oriented SiC layer. The concentrations of Y, Al, and N in the biaxially oriented SiC layer, the unevenness in Y in the thickness direction, the concentration ratio Al/Y, the concentration ratio N/Y, and the density of BPDs on the surface of the SiC epitaxial layer are as shown in Table 1.

[Discussion]

As can be seen from Experimental Examples 1 to 12, to effectively reduce the density of BPDs in the SiC epitaxial layer, the concentration of the rare earth element such as yttrium or samarium in the biaxially oriented SiC layer is preferably in the range of $1\times10^{16}$ to $1\times10^{19}$ atoms/cm$^3$, although the reason for this is unknown. When aluminum is contained in an amount in the range of $1\times10^{16}$ to $1\times10^{21}$ atoms/cm$^3$ in addition to the rare earth element in an amount in the above concentration range, the effect of reducing the density of BPDs is further enhanced. Moreover, when nitrogen is contained in an amount in the range of $1\times10^{17}$ to $1\times10^{22}$ atoms/cm$^3$, the effect was found to be more effective (Experimental Examples 1 to 7 and Experimental Examples 11 and 12). It was also found that (the concentration of Al)/(the concentration of the rare earth element) is preferably $1\times10^{-2}$ to $1\times10^5$ (Experimental Examples 1 to 7) and that (the concentration of N)/(the concentration of the rare earth element) is preferably $1\times10^{-2}$ to $1\times10^5$ (Experimental Examples 1 to 5 and Experimental Example 8). As can be seen from Experimental Examples 13 to 18, when the contents of yttrium, aluminum, and nitrogen are outside the above ranges, the density of BPDs in the SiC epitaxial layer obviously increases.

What is claimed is:

1. A rare earth-containing SiC substrate comprising a rare earth element, Al, and N, wherein a concentration of the rare earth element is from $1\times10^{16}$ atoms/cm$^3$ to $1\times10^{19}$ atoms/cm$^3$ inclusive, a concentration of Al is from $1\times10^{16}$ atoms/cm$^3$ to $1\times10^{21}$ atoms/cm$^3$ inclusive, a concentration of N is from $1\times10^{17}$ atoms/cm$^3$ to $1\times10^{22}$ atoms/cm$^3$ inclusive, and unevenness in the concentration of the rare earth element in a depth direction is 0.9 or more and 2.0 or less as expressed by a coefficient of variation.

2. The rare earth-containing SiC substrate according to claim 1, wherein (the concentration of Al)/(the concentration of the rare earth element) is from $1\times10^{-2}$ to $1\times10^5$ inclusive.

3. The rare earth-containing SiC substrate according to claim 1, wherein (the concentration of N)/(the concentration of the rare earth element) is from $1\times10^{-2}$ to $1\times10^5$ inclusive.

4. The rare earth-containing SiC substrate according to claim 1, wherein the rare earth element is at least one selected from the group consisting of Y, Sm, Ho, Dy, and Yb.

5. The rare earth-containing SiC substrate according to claim 1, wherein the rare earth-containing SiC substrate is oriented in both a c-axis direction and an a-axis direction.

6. A method for producing a SiC epitaxial layer, the method comprising supplying a raw material gas for producing SiC to a surface of the rare earth-containing SiC substrate according to claim 1 to thereby form a SiC epitaxial layer on the surface of the rare earth-containing SiC substrate.

7. The rare earth-containing SiC substrate according to claim 5, wherein, in an inverse pole figure map of the rare earth-containing SiC substrate obtained by using the EBSD method, the following four conditions are satisfied: (A) the rare earth-containing SiC substrate is oriented along a first axis that extends in the substantially normal direction substantially normal to a plate surface of the rare earth-containing SiC substrate; (B) the rare earth-containing SiC substrate is oriented along a second axis that is orthogonal to the first axis and extends in the substantially in-plane plate surface direction of the rare earth-containing SiC substrate; (C) the inclination angles of the rare earth-containing SiC substrate with respect to the first axis are distributed within ±10°; and (D) the inclination angles of the rare earth-containing SiC substrate with respect to the second axis are distributed within ±10°.

8. A SiC composite substrate comprising a SiC single crystal layer and the rare earth-containing SiC substrate according to claim 1, wherein the SiC single crystal layer contains BPDs and the density of BPDs is $1 \times 10^5/cm^2$ or less.

* * * * *